United States Patent
Suh et al.

(10) Patent No.: US 9,448,947 B2
(45) Date of Patent: Sep. 20, 2016

(54) INTER-CHIP MEMORY INTERFACE STRUCTURE

(71) Applicant: QUALCOMM Incorporated, San Diego, CA (US)

(72) Inventors: Jungwon Suh, San Diego, CA (US); Dexter T. Chun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 235 days.

(21) Appl. No.: 13/752,427

(22) Filed: Jan. 29, 2013

(65) Prior Publication Data

US 2013/0326188 A1    Dec. 5, 2013

Related U.S. Application Data

(60) Provisional application No. 61/654,156, filed on Jun. 1, 2012.

(51) Int. Cl.
| | | |
|---|---|---|
| G06F 12/10 | (2016.01) | |
| G11C 5/04 | (2006.01) | |
| G11C 5/06 | (2006.01) | |
| G11C 7/02 | (2006.01) | |
| G11C 7/22 | (2006.01) | |
| H01L 25/065 | (2006.01) | |
| H01L 25/10 | (2006.01) | |

(52) U.S. Cl.
CPC ............. *G06F 12/109* (2013.01); *G11C 5/04* (2013.01); *G11C 5/06* (2013.01); *G11C 5/063* (2013.01); *G11C 7/02* (2013.01); *G11C 7/222* (2013.01); *H01L 25/0657* (2013.01); *H01L 25/105* (2013.01); *H01L 2224/16225* (2013.01); *H01L 2224/48227* (2013.01); *H01L 2924/15311* (2013.01)

(58) Field of Classification Search
CPC ........ H01L 2224/482227; H01L 2224/16225; H01L 2924/15311; H01L 25/00; H01L 2224/16145; H01L 25/0657; H01L 25/105; H01L 2224/48227; G06F 12/0246; G06F 12/0607; G06F 2212/7201; G06F 13/16; G06F 21/79; G06F 12/109; G06F 13/42; G06F 12/00; G11C 5/04; G11C 29/76; G11C 16/0408; G11C 5/06; G11C 11/408; G11C 7/10; G11C 5/063; G11C 7/02; G11C 7/222; G11C 5/02; G11C 29/1201; G11C 8/12
See application file for complete search history.

(56) References Cited

U.S. PATENT DOCUMENTS

| | | | |
|---|---|---|---|
| 5,945,886 A | * | 8/1999 | Millar .................. G06F 13/409 174/250 |
| 7,701,251 B1 | | 4/2010 | Rahman et al. |
| 7,764,564 B2 | | 7/2010 | Saito et al. |

(Continued)

OTHER PUBLICATIONS

International Search Report and Written Opinion—PCT/US2013/043714—ISA/EPO—Jan. 14, 2014.

*Primary Examiner* — Hashem Farrokh

(74) *Attorney, Agent, or Firm* — Kenneth K. Vu; Paul Holdaway

(57) ABSTRACT

In an embodiment, a stacked package-on-package system has a memory die and a logic die. The memory die comprises a first memory and a second memory, each operated independently of the other, and each having an inter-chip interface electrically connected to the logic die. The logic die has two independent clock sources, one to provide a first clock signal to the first memory, and the other clock source to provide a second clock signal to the second memory.

8 Claims, 6 Drawing Sheets

(56) References Cited

U.S. PATENT DOCUMENTS

| | | |
|---|---|---|
| 8,683,164 B2 * | 3/2014 | Jeddeloh .................. 711/167 |
| 8,713,248 B2 * | 4/2014 | Aho et al. ................. 711/105 |
| 2009/0161401 A1 * | 6/2009 | Bilger et al. ................ 365/51 |
| 2010/0082911 A1 | 4/2010 | Das |
| 2010/0174858 A1 | 7/2010 | Chen et al. |
| 2010/0195421 A1 | 8/2010 | Jeddeloh |
| 2012/0051171 A1 * | 3/2012 | Swanson et al. .......... 365/233.1 |
| 2012/0137090 A1 * | 5/2012 | Biswas et al. ............. 711/157 |
| 2012/0155142 A1 * | 6/2012 | King ........................ 365/63 |
| 2013/0159587 A1 * | 6/2013 | Nygren et al. ............. 710/306 |

* cited by examiner

INTER-CHIP MEMORY INTERFACE STRUCTURE

CLAIM OF PRIORITY UNDER 35 U.S.C. §119

The present Application for Patent claims priority to Provisional Application No. 61/654,156 entitled "INTER-CHIP MEMORY INTERFACE STRUCTURE" filed 1 Jun. 2012, and assigned to the assignee hereof and hereby expressly incorporated by reference herein.

FIELD OF DISCLOSURE

The invention is related to packaged integrated circuits, and more particularly, to a stacked package-on-package integrated circuit having a logic chip in electrical communication with a memory chip.

BACKGROUND

The central processing unit (CPU) and memory inter-chip interface is very important for system performance and power. As systems require more performance, the data traffic between a CPU and local memory increases, pushing up the inter-chip interface speed for high data bandwidth. However, a high-speed inter-chip interface often suffers from clock jitter and clock-to-signal skews.

FIG. 1 is a simplified cross-sectional view of a stacked POP (Package-On-Package) system comprising two memory chips (dice) labeled 102 and 104, and a logic chip (die) labeled 106. The logic chip 106 comprises a CPU (not shown), where memory chips 102 and 104 are part of the memory hierarchy available to the CPU.

The memory chips 102 and 104 are electrically connected to the logic chip 106. Wires 107 electrically connect the memory chips to contact pads (not shown) on the package substrate 108, and vias (not shown) in the package substrate 108 provide electrical connection to the package balls 110. Package balls 110 provide electrical connection to the logic chip 106 by way of interconnects (not shown) on the package substrate 112 and by way of the package balls 114.

Package balls 116 are electrically connected to the package balls 114 by way of vias (not shown) in the package substrate 112 so that the logic chip 106 may be electrically connected to other packaged integrated circuits by way of a printed circuit board (not shown).

Many mobile systems have multiple memory channels, where it is common for each memory channel interface to have a 32-bit I/O (Input/Output) width. The physical implementation of this interface is segmented across the dice in a stacked package. This distributed segmentation feature is illustrated in FIG. 2, which abstracts the memory-to-CPU interface in the POP system of FIG. 1.

Referring to FIG. 2, the plane labeled 202 represents a memory chip, and the plane labeled 204 represents a logic chip. An inter-chip interface on the memory chip 202 is segmented into two structures labeled 206 and 208. This inter-chip interface includes interconnects for a clock signal, command signals, power rails, ground rails, address signals, write data signals, and read data signals, for example.

The corresponding inter-chip interface on the logic chip 204 is segmented in the same way as on the memory chip, and is abstracted by the two structures labeled 210 and 212. The line labeled 214 abstracts the interconnects between the structures 206 and 210, and the line labeled 216 abstracts the interconnects between the structures 208 and 212. Accordingly, the lines 214 and 216 will be referred to as interconnects. The structures in the cross-sectional view of FIG. 1 corresponding to the combination of the interconnects 214 and 216 are the wires 107, the vias within the package substrate 108, the package balls 110, the interconnects on the package substrate 112, and the package balls 114.

A reason for physically segmenting the inter-chip interface is because of constraints imposed by the layout of die pads and package balls. The functional unit 218 abstracts the clock source and set of drivers to drive the inter-chip interface. For proper operation, the clock source represented by the functional unit 218 must maintain the same clock phase over the two portions of the inter-chip interface, even though these two portions of the inter-chip interface are physically placed near opposite ends of the logic chip 204.

The structures represented by the labels 206, 208, 210, 212, 214, and 216 contribute to the overall electrical length of the inter-chip interface for coupling the memory chip 202 to the logic chip 204. The physical distribution and segmentation of this single interface over the two chips as indicated in FIG. 2 contribute to clock signal jitter skews, which limits the overall system frequency and performance.

SUMMARY

Exemplary embodiments of the invention are directed to systems and method for a stacked package-on-package system having a memory die and a logic die, where the memory die comprises a first memory and a second memory, each operated independently of the other, and each having an inter-chip interface electrically connected to the logic die.

In an embodiment, a stacked package-on-package system comprises a first die and a second die. The first die comprises a plurality of memory cells configured into a first memory and a second memory. The second die comprises a central processing unit; a bus coupled to the central processing unit; a memory management unit coupled to the bus; a first clock source coupled to the memory management unit to provide a first clock signal to the first memory; and a second clock source coupled to the memory management unit to provide a second clock signal to the second memory; wherein the first and second clock sources are independent of each other.

In another embodiment, a method is disclosed for a memory management unit to access physical memory on a memory semiconductor die. The method includes translating addresses in an address space into either physical addresses in a first physical address space or physical addresses in a second physical address space, wherein the sizes of the first and second physical address spaces are each one-half the size of the address space; writing data having a physical address in the first physical address space only to a first memory on the memory semiconductor die; writing data having a physical address in the second physical address space only to a second memory on the memory semiconductor die; reading data having a physical address in the first physical address space only from the first memory on the memory semiconductor die; and reading data having a physical address in the second physical address space only from the second memory on the memory semiconductor die.

In another embodiment, a computer readable non-transitory medium has instructions stored thereon that when executed by a processor perform a method. The method comprises translating addresses in an address space into either physical addresses in a first physical address space or physical addresses in a second physical address space, wherein the sizes of the first and second physical address spaces are each one-half the size of the address space; writing data having a physical address in the first physical address space only to a first memory on a memory semiconductor die; writing data having a physical address in the second physical address space only to a second memory on the memory semiconductor die; reading data having a physical address in the first physical address space only from the first memory on the memory semiconductor die; and reading data having a physical address in the second physical address space only from the second memory on the memory semiconductor die.

In another embodiment, a stacked package-on-package system comprises a first die; a second die; a first memory formed in the first die; a second memory formed in the first die; and a memory management means for managing memory reads and writes, where the memory management means is formed in the second die. The memory management means translates addresses in an address space into either physical addresses in a first physical address space or physical addresses in a second physical address space, wherein the sizes of the first and second physical address spaces are each one-half the size of the address space; writes data having a physical address in the first physical address space only to the first memory; writes data having a physical address in the second physical address space only to the second memory; reads data having a physical address in the first physical address space only from the first memory; and reads data having a physical address in the second physical address space only from the second memory.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
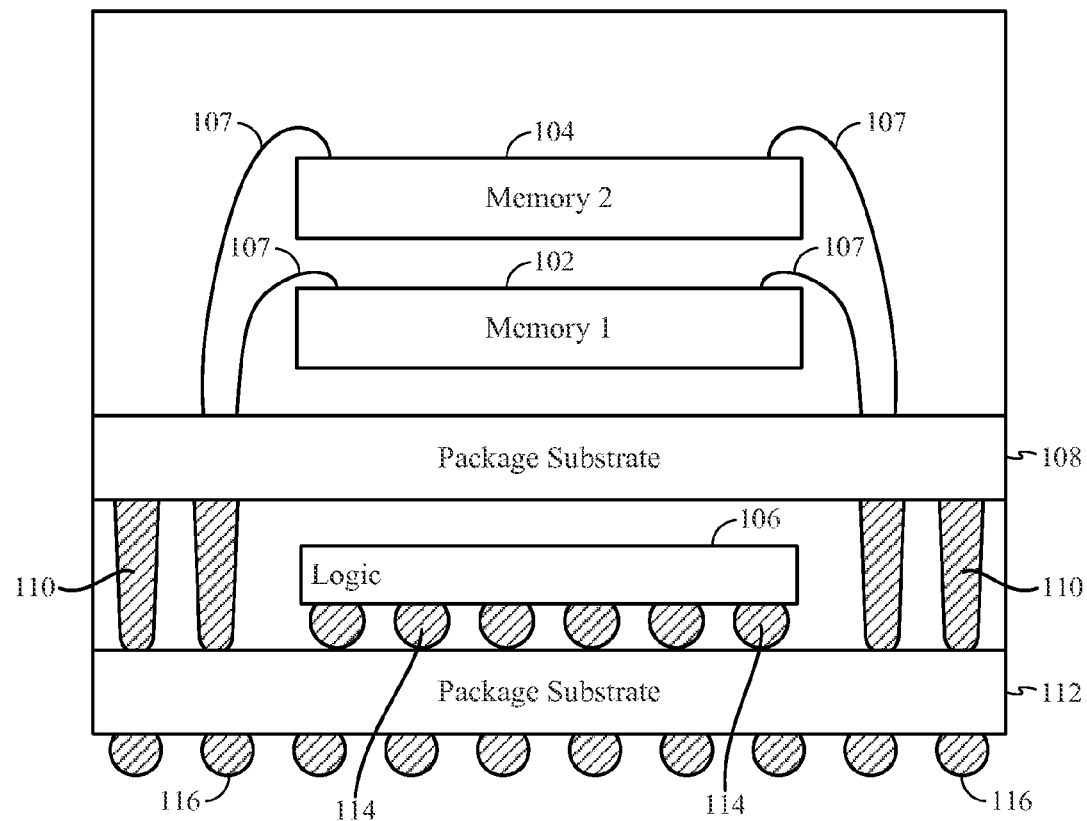
FIG. 1 is a cross-sectional view of a conventional stacked package-on-package system for integrated circuits.
Figure 2:
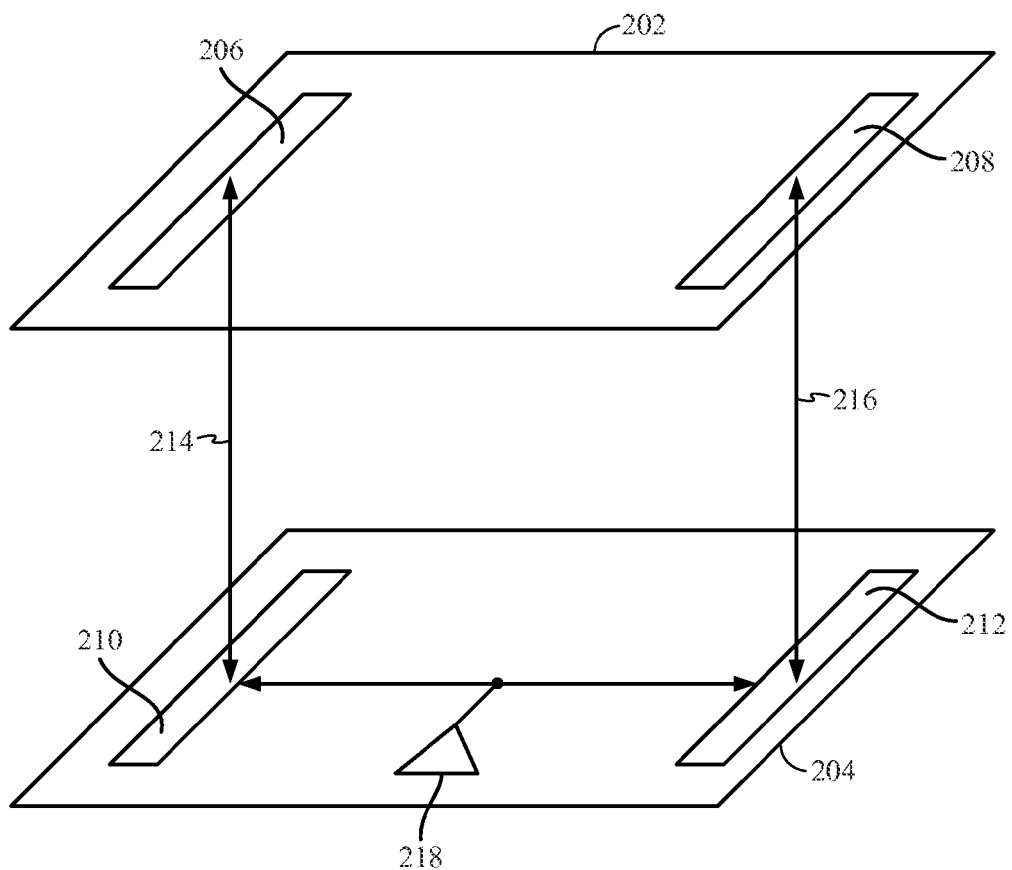
FIG. 2 is an abstraction of a conventional memory-to-CPU inter-chip interface.
Figure 3:
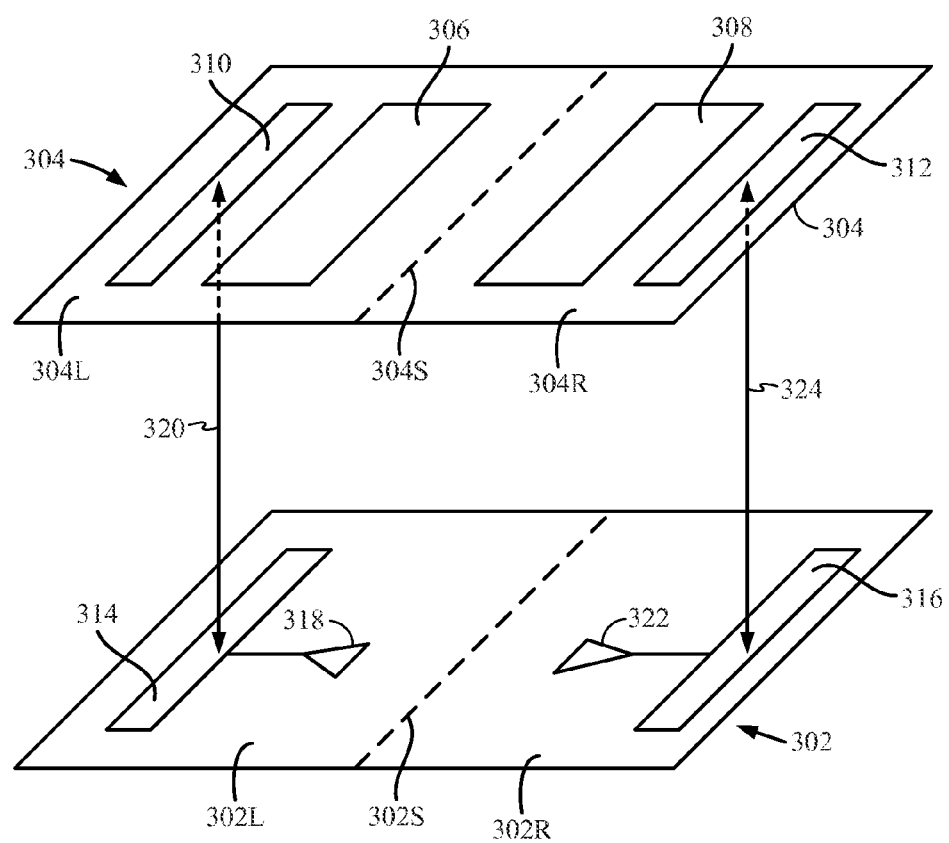
FIG. 3 illustrates a logical view of a memory-to-CPU inter-chip interface according to an embodiment.

FIG. 3 illustrates a memory-to-CPU inter-chip interface according to an embodiment. The plane labeled 302 abstracts a logic chip (die), which includes a CPU (not shown). The plane labeled 304 abstracts a memory chip. Although the memory chip 304 illustrated in FIG. 3 consists of a single die, the memory cells on this single die are logically partitioned into two parts labeled 306 and 308. These two parts of the memory may share the same ground and power buses, but their signal lines for commands, read data, write data, and clock signals are separate from each other. In practice, the chips 302 and 304 are packaged into a stacked package-on-package system. Other chips may be stacked onto these two chips and integrated into the same package system, but for ease of illustration only two chips are shown in FIG. 3.

The structure labeled 310 abstracts the inter-chip interface for the memory part 306 comprising various interconnects for command signals, read data signals, write data signals, and a clock signal. Similarly, the structure labeled 312 abstracts the inter-chip interface for the memory part 308 comprising various interconnects for command signals, read data signals, write data signals, and a clock signal.

The structure labeled 314 abstracts the part of the inter-chip interface on the logic chip 302 that is electrically connected to the inter-chip interface 310 on the memory chip 304. Similarly, the structure labeled 316 abstracts the part of the inter-chip interface on the logic chip 302 that is electrically connected to the inter-chip interface 312 on the memory chip 304.

The functional unit labeled 318 represents a clock source, a set of drivers, and a logic block on the logic chip 302. The functional unit 318 provides a clock signal, command signals, read data signals, and write data signals to the memory part 306 by way of inter-chip interfaces 314 and 310. The line 320 represents the electrical interconnects between the inter-chip interfaces 314 and 310.

The functional unit labeled 322 represents a clock source, a set of drivers, and a logic block on the logic chip 302. The functional unit 322 provides a clock signal, command signals, read data signals, and write data signals to the memory part 308 by way of inter-chip interfaces 316 and 312. The line 324 represents the electrical interconnects between the inter-chip interfaces 316 and 312.

Figure 4:
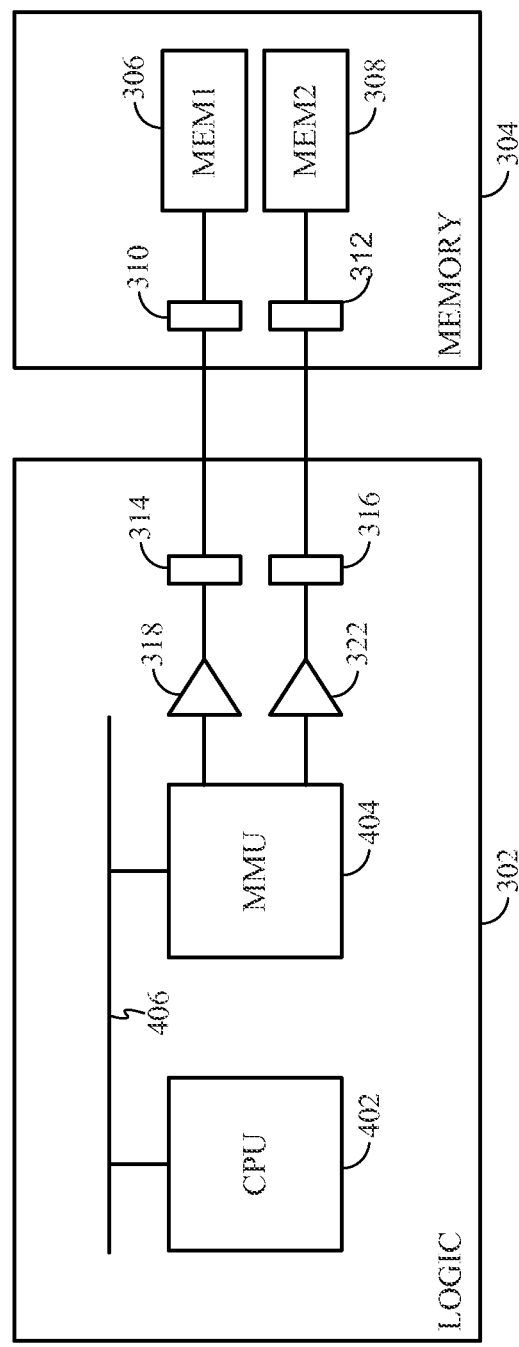
FIG. 4 illustrates another logical view of a memory-to-CPU inter-chip interface according to an embodiment.

The signals provided by functional units 318 and 322 are independent of each other. In particular, the clock signals provided by the clock sources in these two functional units are independent of each other. Each clock source need only drive its associated interface, where each interface is electrically independent of the other. Each inter-chip interface illustrated in the embodiment of FIG. 4 is electrically independent, and need not be distributed on opposite sides of a package system as in other kinds of inter-chip interfaces. This helps in mitigating clock jitter and skew for better system level timing margin.

Implementing two separate inter-chip interfaces as opposed to implementing a single, unified inter-chip interface trades off signal path length with the total number of signal lines and drivers used to control and access the memory cells integrated on the memory chip 304. To illustrate this tradeoff, consider FIG. 4. FIG. 4 is a logical representation of the embodiment of FIG. 3, showing a CPU 402 and a memory management unit 404 connected to each other by way of a system bus 406. Suppose the total memory size of the memory chip 304 is 1 GB. If a single inter-chip interface were used, then the number of address lines would be 20. By logically grouping the memory cells such that memory part 306 and memory part 308 are each 0.5 GB, each inter-chip interface 314 and 316 has 19 address lines, for a total of 38 address lines.

Consequently, in the above example, by utilizing independent, self-contained interfaces, the total number of address lines is 38 rather than the 20 needed if a single, unified interface was used. However, because each group of 19 is electrically independent of the other, the signal path length for each interface is only half that for a unified interface.

Shortening signal path length provides several improvements. For example, fewer buffers need to be introduced, resulting in less clock signal jitter. Shorter signal path lengths introduce less clock signal skew. Also, smaller buffers may be utilized and there is less overall capacitance for each signal line, which helps to reduce power consumption in both the CPU and the memory. Embodiments are expected to achieve higher clock frequencies because of less clock signal jitter, skew, and power consumption.

For some embodiments, the memory parts 306 and 308, and their corresponding interfaces, may be symmetrically laid out in the memory semiconductor die represented by the memory chip 304. For example, with the dashed line 304S representing a line of symmetry in the memory chip 304 dividing the memory semiconductor die represented by the memory chip 304 into a left half 304L and a right half 304R, the memory part 306 lies in the left half 304L and the memory part 308 lies in the right half 304R.

For some embodiments, the functional units 318 and 322, and their corresponding interfaces, may be symmetrically laid out in the memory semiconductor die represented by the logic chip 302. For example, with the dashed line 302S representing a line of symmetry in the logic chip 302 dividing the logic semiconductor die represented by the logic chip 302 into a left half 302L and a right half 302R, the functional unit 318 lies in the left half 302L and the functional unit 322 lies in the right half 302R.

The CPU 402 sees the same address space whether two inter-chip interfaces are implemented, or a single inter-chip interface is used. The memory management unit 404 hides the implementation of the inter-chip interface. The memory management unit translates a particular address so that the translated address is driven on either interface 314 or interface 316, but not both.

Figure 5:
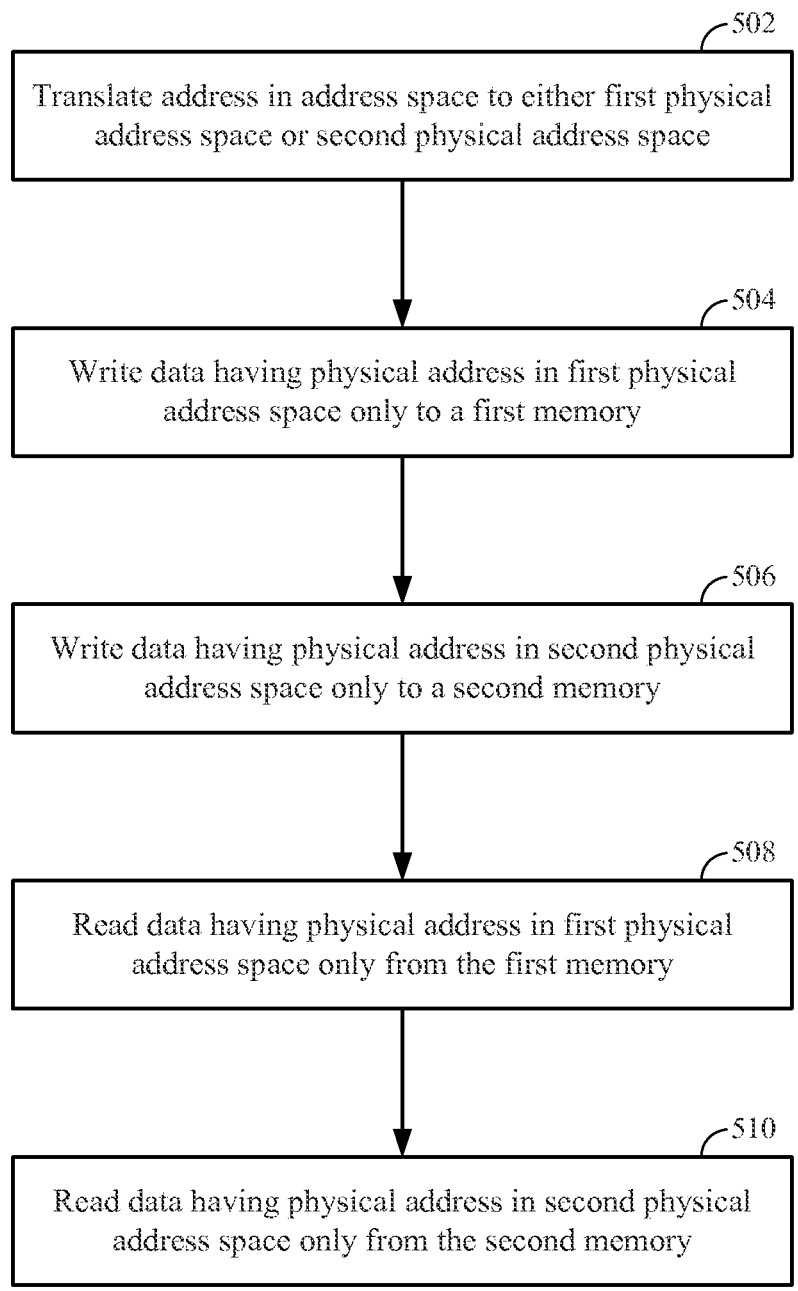
FIG. 5 is a flow diagram illustrating a method of address translation, as well as writing and reading data, according to an embodiment.

FIG. 5 is a flow diagram illustrating the above-described method of address translation, as well as writing and reading data, according to an embodiment. In step 502, the MMU 404 translates addresses in the address space seen by the CPU 402 into either physical addresses in a first physical address space or physical addresses in a second physical address space. The sizes of the first and second physical address spaces are each one-half the size of the address space seen by the CPU 402.

As indicated in step 504, when the MMU 404 is writing data having a physical address in the first physical address space, the data is written only to a first memory on the memory chip 304. For example, the first memory may be the memory part 306. Similarly, as indicated in step 506, when the MMU 404 is writing data having a physical address in the second physical address space, the data is written only to a second memory on the memory chip 304. For example, the second memory may be the memory part 308.

As indicated in step 508, when the MMU 404 is reading data having a physical address in the first physical address space, the data is read only from the first memory on the memory chip 304. Similarly, as indicated in step 510, when the MMU 404 is reading data having a physical address in the second physical address space, the data is read only from the second memory on the memory chip 304.

FIG. 5 is a flow diagram illustrating a procedure that may be carried out by the MMU 404 under instructions stored in a memory. The memory may be the memory part 306 or 308, or it may be memory integrated with the MMU 404. Such memory may be referred to as a non-transitory computer readable memory having instructions stored thereon.

Figure 6:
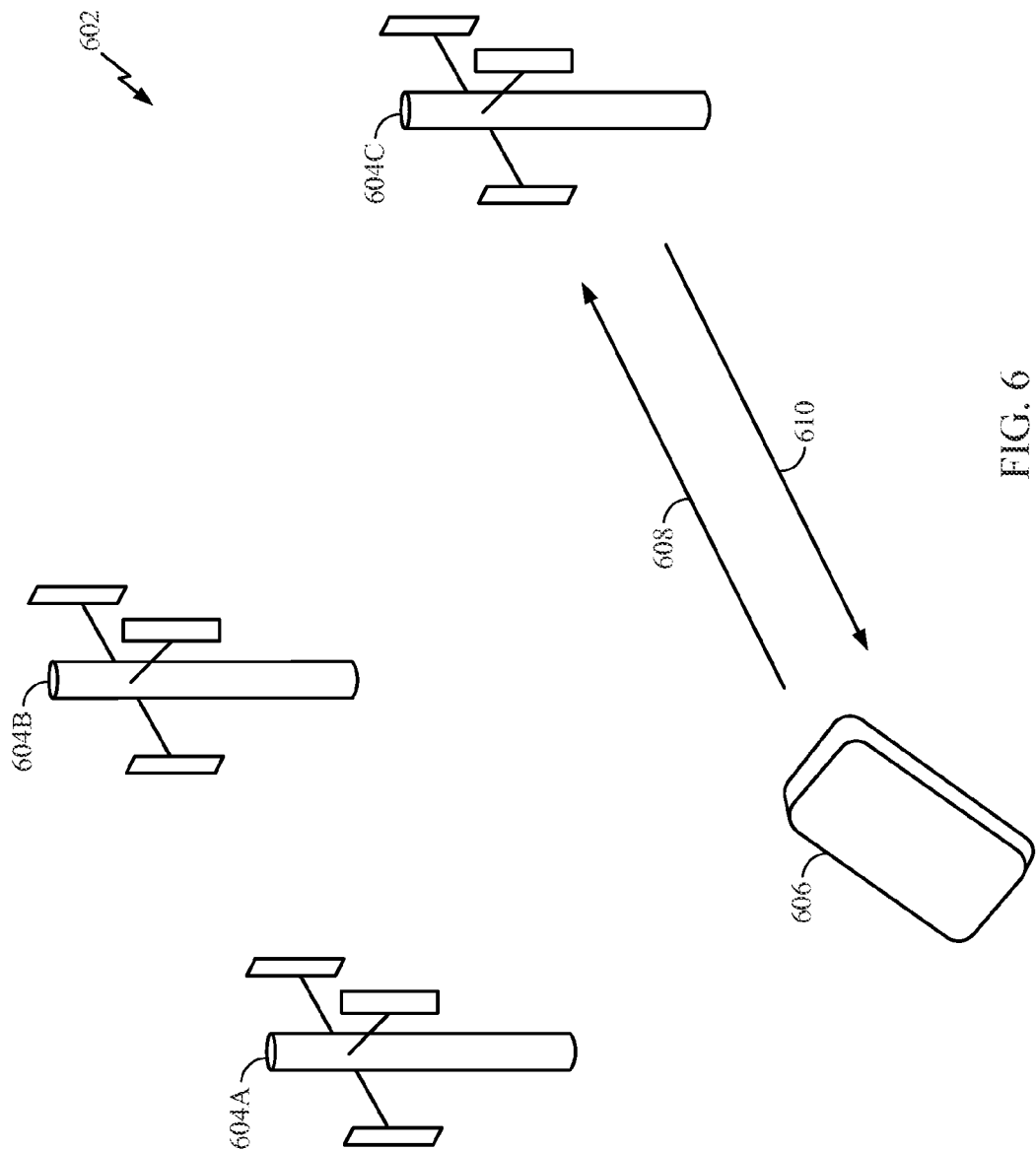
FIG. 6 illustrates a wireless communication network employing an embodiment.

Embodiments may find widespread application in numerous communication systems, such as a cellular phone network. For example, FIG. 6 illustrates a cellular phone network 602 comprising the base stations 604A, 604B, and 604C. FIG. 6 shows a communication device, labeled 606, which may be a mobile cellular communication device such as a so-called smart phone, a tablet, or some other kind of communication device suitable for a cellular phone network. The communication device 606 need not be mobile. In the particular example of FIG. 6, the communication device 606 is located within the cell associated with the base station 604C. The arrows 608 and 610 pictorially represent the uplink channel and the downlink channel, respectively, by which the communication device 606 communicates with the base station 604C.

Embodiments may be used in data processing systems associated with the communication device 606, or with the base station 604C, or both, for example. FIG. 6 illustrates only one application among many in which the embodiments described herein may be employed.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for reading and writing data with an inter-chip memory interface structure as described previously. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus comprising a stacked package-on-package system, the stacked package-on-package system comprising:
    a first die, the first die comprising a plurality of memory cells configured into a first memory and a second memory, the first die having a first half comprising the first memory and a second half comprising the second memory; and
    a second die, the second die comprising
        a central processing unit;
        a bus coupled to the central processing unit;
        a memory management unit coupled to the bus;
        a first clock source coupled to the memory management unit to provide a first clock signal to the first memory;
        a second clock source coupled to the memory management unit to provide a second clock signal to the second memory wherein the first clock signal is independent of the second clock signal, wherein the first and second clock sources are independent of each other;
        a first functional unit coupled to the memory management unit to drive a first set of read data signals and a first set of write data signals to the first memory;
        a second functional unit coupled to the memory management unit to drive a second set of read data signals and a second set of write data signals to the second memory;
        the first functional unit driving the first set of read data signals independently of the second functional unit driving the second set of read data signals;
        the first functional unit driving the first set of write data signals independently of the second functional unit driving the second set of write data signals; and
    a first interconnect coupling the first clock source to the first memory, and a second interconnect coupling the second clock source to the second memory, the first clock source to drive the first interconnect to clock the first memory, the second clock source to drive the second interconnect to clock the second memory, wherein the first and second interconnects are electrically independent of each other.

2. The apparatus of claim 1, wherein the memory management unit translates an address into either a first physical address or a second physical address, the address belonging to an address space, the first physical address belonging to a first physical address space associated with the first memory, the second physical address belonging to a second physical address space associated with the second memory, wherein the first and second physical address spaces each have a size one-half that of the address space.

3. The apparatus of claim 1, wherein the apparatus is a communication device selected from group consisting of a base station, a cellular phone, and a tablet.

4. A method for a memory management unit on a logic semiconductor die to access physical memory on a memory semiconductor die, the method comprising:
    translating addresses in an address space into either physical addresses in a first physical address space or physical addresses in a second physical address space, wherein the first and second physical address spaces each have a size one-half that of the address space;
    writing data having a physical address in the first physical address space only to a first memory on the memory semiconductor die;
    writing data having a physical address in the second physical address space only to a second memory on the memory semiconductor die;
    reading data having a physical address in the first physical address space only from the first memory on the memory semiconductor die;
    reading data having a physical address in the second physical address space only from the second memory on the memory semiconductor die;
    writing data having a physical address in the first physical address space only to the first memory on the memory semiconductor die by driving data signals over a first interconnect coupling a first interface on the memory semiconductor die to a first interface on the logic semiconductor die with a first functional unit, the logic semiconductor die having a first half and a second half, the first interface on the logic semiconductor die and the first functional unit formed on the first half of the logic semiconductor die;
    writing data having a physical address in the second physical address space only to the second memory on the memory semiconductor die by driving data signals over a second interconnect coupling a second interface on the memory semiconductor die to a second interface on the logic semiconductor die with a second functional unit independently of the first functional unit, the second interface on the logic semiconductor die and the second functional unit formed on the second half of the logic semiconductor die;

wherein the memory semiconductor die comprises a first half and a second half, wherein the first memory lies in the first half and the second memory lies in the second half, wherein the first and second interconnects are electrically independent of each other;

reading data having a physical address in the first physical address space only from the first memory by reading data signals on the first interface on the memory semiconductor die with the first functional unit; and reading data having a physical address in the second physical address space only from the second memory by reading data signals on the second interface on the memory semiconductor die with the second functional unit independently of the first functional unit, wherein the memory semiconductor die and the logic semiconductor die are included in a single stacked package-on-package system.

5. A non-transitory computer readable medium having instructions stored thereon that when executed by a processor perform a method comprising:

translating addresses in an address space into either physical addresses in a first physical address space or physical addresses in a second physical address space, wherein the first and second physical address spaces each have a size one-half that of the address space;

writing data having a physical address in the first physical address space only to a first memory on a memory semiconductor die;

writing data having a physical address in the second physical address space only to a second memory on the memory semiconductor die;

reading data having a physical address in the first physical address space only from the first memory on the memory semiconductor die;

reading data having a physical address in the second physical address space only from the second memory on the memory semiconductor die;

writing data having a physical address in the first physical address space only to the first memory on the memory semiconductor die by driving data signals over a first interconnect coupling a first interface on the memory semiconductor die to a first interface on a logic semiconductor die with a first functional unit, the logic semiconductor die having a first half and a second half, the first interface on the logic semiconductor die and the first functional unit formed on the first half of the logic semiconductor die;

writing data having a physical address in the second physical address space only to the second memory on the memory semiconductor die by driving data signals over a second interconnect coupling a second interface on the memory semiconductor die to a second interface on the logic semiconductor die with a second functional unit independently of the first functional unit, the second interface on the logic semiconductor die and the second functional unit formed on the second half of the logic semiconductor die;

wherein the memory semiconductor die comprises a first half and a second half, wherein the first memory lies in the first half and the second memory lies in the second half, wherein the first and second interconnects are electrically independent of each other;

reading data having a physical address in the first physical address space only from the first memory by reading data signals on the first interface on the memory semiconductor die with the first functional unit; and reading data having a physical address in the second physical address space only from the second memory by reading data signals on the second interface on the memory semiconductor die with the second functional unit independently of the first functional unit, wherein the memory semiconductor die and the logic semiconductor die are included in a single stacked package-on-package system.

6. The non-transitory computer readable medium of claim 5, wherein the processor is part of a memory management unit.

7. An apparatus comprising a stacked package-on-package system, the stacked package-on-package system comprising:

a first die;
a second die;
a first memory formed in the first die;
a second memory formed in the first die; and
a memory management means for managing memory reads and writes, the memory management means formed in the second die, the memory management means to:

translate addresses in an address space into either physical addresses in a first physical address space or physical addresses in a second physical address space, wherein the first and second physical address spaces each have a size one-half that of the address space;

write data having a physical address in the first physical address space only to the first memory;

write data having a physical address in the second physical address space only to the second memory;

read data having a physical address in the first physical address space only from the first memory;

read data having a physical address in the second physical address space only from the second memory;

write data having a physical address in the first physical address space only to the first memory by driving data signals over a first interconnect coupling a first interface on the first die to a first interface on the second die with a first functional unit, the second die having a first half and a second half, the first interface on the second die and the first functional unit formed on the first half of the second die;

write data having a physical address in the second physical address space only to the second memory by driving data signals over a second interconnect coupling a second interface on the first die to a second interface on the second die with a second functional unit independently of the first functional unit, the second interface on the second die and the second functional unit formed on the second half of the second die;

wherein the first die comprises a first half and a second half, wherein the first memory lies in the first half and the second memory lies in the second half, wherein the first and second interconnects are electrically independent of each other;

read data having a physical address in the first physical address space only from the first memory by reading data signals on the first interface on the first die with the first functional unit; and read data having a physical address in the second physical address space only from the second memory by reading data signals on the second interface on the first die with the second functional unit independently of the first functional unit.

8. The apparatus of claim 7, wherein the apparatus is a communication device selected from group consisting of a base station, a cellular phone, and a tablet.

* * * * *